(12) United States Patent
Hisashima et al.

(10) Patent No.: US 11,815,552 B2
(45) Date of Patent: Nov. 14, 2023

(54) CLOCK FREQUENCY MONITORING DEVICE AND CLOCK FREQUENCY MONITORING METHOD

(71) Applicant: Nippon Telegraph and Telephone Corporation, Tokyo (JP)

(72) Inventors: Takaaki Hisashima, Tokyo (JP); Hiroki Sakuma, Tokyo (JP); Kaoru Arai, Tokyo (JP); Ryuta Sugiyama, Tokyo (JP); Shunichi Tsuboi, Tokyo (JP); Osamu Kurokawa, Tokyo (JP); Kazuyuki Matsumura, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 489 days.

(21) Appl. No.: 17/267,161

(22) PCT Filed: Jul. 16, 2019

(86) PCT No.: PCT/JP2019/027839
§ 371 (c)(1),
(2) Date: Feb. 9, 2021

(87) PCT Pub. No.: WO2020/031623
PCT Pub. Date: Feb. 13, 2020

(65) Prior Publication Data
US 2021/0302499 A1 Sep. 30, 2021

(30) Foreign Application Priority Data
Aug. 9, 2018 (JP) ................................ 2018-150005

(51) Int. Cl.
*G06F 1/12* (2006.01)
*G01R 31/317* (2006.01)
(Continued)

(52) U.S. Cl.
CPC ........ *G01R 31/31726* (2013.01); *G06F 1/12* (2013.01); *H03K 5/00006* (2013.01); *H03K 5/1252* (2013.01); *H03K 5/26* (2013.01)

(58) Field of Classification Search
CPC .. G01R 31/31726; H03K 5/00006; G06F 1/12
See application file for complete search history.

(56) References Cited

U.S. PATENT DOCUMENTS 8,705,680 B2 * 4/2014 Terada .................... H03L 7/093
375/373

FOREIGN PATENT DOCUMENTS

JP H0211022 1/1990
JP H06104882 4/1994
(Continued)

*Primary Examiner* — Alesa Allgood
(74) *Attorney, Agent, or Firm* — Fish & Richardson P.C.

(57) ABSTRACT

[Problem] To monitor a frequency difference between an input clock and a synchronous clock synchronized with the input clock.
[Solution] A clock frequency monitoring apparatus that monitors the frequency of an input clock 18a includes a phase comparator 12 that compares a phase of a synchronous clock 18e phase-synchronized with the input clock 18a or a first frequency-divided clock 18f obtained by frequency-dividing the synchronous clock 18e with the phase of the input clock 18a, a filter 13 that low-pass filters an output signal of the phase comparator 12, an oscillator 14 that generates the synchronous clock 18e having a frequency corresponding to a control value from the filter 13, and a determiner 19 that determines that the frequency of the input clock 18a is abnormal when the variation amplitude of the output signal of the filter 13 is equal to or more than a predetermined range.

6 Claims, 7 Drawing Sheets

(51) Int. Cl.
*H03K 5/00* (2006.01)
*H03K 5/1252* (2006.01)
*H03K 5/26* (2006.01)

(56) References Cited

FOREIGN PATENT DOCUMENTS

| | | |
|---|---|---|
| JP | H10163863 | 6/1998 |
| JP | H1132384 | 2/1999 |
| JP | 2016-19046 | 2/2016 |
| JP | 5940694 | 6/2016 |

\* cited by examiner

CLOCK FREQUENCY MONITORING DEVICE AND CLOCK FREQUENCY MONITORING METHOD

CROSS-REFERENCE TO RELATED APPLICATIONS

This application is a National Stage application under 35 U.S.C. § 371 of International Application No. PCT/JP2019/027839, having an International Filing Date of Jul. 16, 2019, which claims priority to Japanese Application Serial No. 2018-150005, filed on Aug. 9, 2018. The disclosure of the prior application is considered part of the disclosure of this application, and is incorporated in its entirety into this application.

TECHNICAL FIELD

The present disclosure relates to a clock frequency monitoring apparatus and a clock frequency monitoring method.

BACKGROUND ART

Currently, most communication services such as telephones and dedicated lines use digital transmission methods. In the digital transmission methods, it is necessary to perform network synchronization such that the operation clocks of apparatuses in a network match to enable multiplexing/demultiplexing and cross-connecting. In Japan, a master-slave synchronization method in which the clock frequency of a slave station is synchronized with the clock frequency of a master station is used to achieve network synchronization and a clock network has a hierarchical network configuration with a standard clock generator at the top (FIG. 1).

Patent Literature 1 discloses a technology in which, when frequency synchronization is performed between apparatuses connected in a network, apparatuses on the upstream side transmit information indicating the quality states of frequency synchronization to apparatuses on the downstream side.

CITATION LIST

Patent Literature

Patent Literature 1: JP 5940694 B (paragraph 0002)

SUMMARY OF THE INVENTION

Technical Problem

Incidentally, when frequency synchronization is performed in a network, in order to improve reliability, redundancy is implemented in receivers that receive clocks from higher-level apparatuses. In this configuration, when a synchronous clock (a selected-system clock) synchronized with a clock distributed from any of a plurality of apparatuses on the upstream side cannot be distributed, a synchronous clock synchronized with a clock (a standby-system clock) distributed from another apparatus on the upstream side is distributed.

However, the technology disclosed in Patent Literature 1 does not have a means for checking clock accuracy. Particularly, when a selected-system clock is distributed using the technology disclosed in Patent Literature 1, reference information such as a Global Positioning System (GPS) or a cesium oscillator is needed to check the accuracy of a standby-system clock.

The present disclosure has been made to solve such problems and it is an object of the present disclosure to provide a clock frequency monitoring apparatus and a frequency monitoring method which can monitor the frequency difference between an input clock and a synchronous clock synchronized with the input clock.

Means for Solving the Problem

The disclosure according to first aspect provides a clock frequency monitoring apparatus that recovers a synchronous clock synchronized with a first input clock (for example, a selected-system clock) and monitors a frequency of a second input clock (for example, a standby-system clock) that is to be frequency-synchronized with the first input clock, the clock frequency monitoring apparatus including a first phase comparator (12) configured to compare a phase of the synchronous clock or a first frequency-divided clock obtained by frequency-dividing the synchronous clock with a phase of the first input clock, a first filter (CPU 13) configured to low-pass filter an output signal of the first phase comparator, an oscillator (14) configured to generate the synchronous clock having a frequency corresponding to an output signal (for example, a control value) of the first filter, a second phase comparator (32) configured to compare a phase of the synchronous clock or the first frequency-divided clock with a phase of the second input clock, a second filter (CPU 33) configured to low-pass filter an output signal of the second phase comparator, and a determiner (7) configured to determine that the frequency of the second input clock is abnormal when a variation amplitude of an output signal of the second filter is equal to or more than a predetermined range. Reference signs or letters in parentheses are reference signs or the like given in the embodiments and do not limit the present disclosure.

According to the disclosure of first aspect, the synchronous clock phase-synchronized with the first input clock is generated. The variation amplitude of the output signal of the second filter becomes large if the phase lock between the second input clock and the synchronous clock or the first frequency-divided clock obtained by frequency-dividing the synchronous clock is lost. Therefore, frequency abnormality of the second input clock can be determined by monitoring the variation amplitude of the output signal of the second filter.

The disclosure according to second aspect provides the clock frequency monitoring apparatus according to first aspect, wherein the predetermined range is changed by a temperature of the clock frequency monitoring apparatus. According to this, abnormality determination can be performed in consideration of noise that changes with temperature.

The disclosure according to third aspect provides a clock frequency monitoring apparatus that monitors a frequency of an input clock (18a) (a selected-system clock or a standby-system clock), the clock frequency monitoring apparatus including a phase comparator (12) configured to compare a phase of a synchronous clock (18e) phase-synchronized with the input clock or a first frequency-divided clock (180 obtained by frequency-dividing the synchronous clock with a phase of the input clock, a filter (CPU 13) configured to low-pass filter an output signal of the phase comparator, an oscillator (14) configured to generate the synchronous clock having a frequency corresponding to an output signal (for example, a control value) of the filter, and a determiner (19) configured to determine that the frequency of the input clock is abnormal when a variation amplitude of an output signal of the filter is equal to or more than a predetermined range.

In the disclosure according to third aspect, the variation amplitude of the output signal of the filter becomes large if the phase lock between the input clock and the synchronous clock is lost. Therefore, frequency abnormality of the input clock can be determined by monitoring the variation amplitude of the output signal of the filter.

The disclosure according to fourth aspect provides the clock frequency monitoring apparatus according to any one of aspects 1 to 3, further including a distributor (22a, 22b) configured to distribute the synchronous clock or a frequency-divided clock (20a, 20b) obtained by frequency-dividing the synchronous clock. According to this, the synchronous signal or the frequency-divided signal obtained by frequency-dividing the synchronous signal is distributed to the downstream side.

The disclosure according to fifth aspect provides a clock frequency monitoring method performed by a clock frequency monitoring apparatus that recovers a synchronous clock synchronized with a first input clock and monitors a frequency of a second input clock that is to be frequency-synchronized with the first input clock, the clock frequency monitoring method including the steps of first comparing a phase of the synchronous clock or a first frequency-divided clock obtained by frequency-dividing the synchronous clock with a phase of the first input clock, first low-pass filtering an output signal of the first comparing step, causing an oscillator to generate the synchronous clock having a frequency corresponding to a first filtered signal calculated in the first low-pass filtering step, second comparing a phase of the synchronous clock or the first frequency-divided clock with a phase of the second input clock, performing second low-pass filtering calculation of an output signal of the second comparing step, and determining that the frequency of the second input clock is abnormal when a variation amplitude of a second low-pass filtered signal calculated in the performing step is equal to or more than a predetermined range.

According to the disclosure of fifth aspect, the synchronous clock phase-synchronized with the first input clock is generated. The variation amplitude of the second low-pass filtered signal calculated in the performing step becomes large if the phase lock between the second input clock and the synchronous clock or the first frequency-divided clock obtained by frequency-dividing the synchronous clock is lost. Therefore, frequency abnormality of the second input clock can be determined by monitoring the variation amplitude of the second low-pass filtered signal.

The disclosure according to sixth aspect provides a clock frequency monitoring method performed by a clock frequency monitoring apparatus that monitors a frequency of an input clock, the clock frequency monitoring method including the steps of comparing a phase of a synchronous clock phase-synchronized with the input clock or a first frequency-divided clock obtained by frequency-dividing the synchronous clock with a phase of the input clock, low-pass filtering an output signal of the comparing step, causing an oscillator to generate the synchronous clock having a frequency corresponding to a low-pass filtered signal calculated in the low-pass filtering step, and determining that the frequency of the input clock is abnormal when a variation amplitude of the low-pass filtered signal is equal to or more than a predetermined range.

Therefore, frequency abnormality of the input clock can be determined by monitoring the variation amplitude of the output signal of the filter.

Effects of the Invention

According to the present disclosure, the frequency difference between an input clock and the synchronous clock synchronized with the input clock can be monitored.

DESCRIPTION OF EMBODIMENTS

Figure 1:
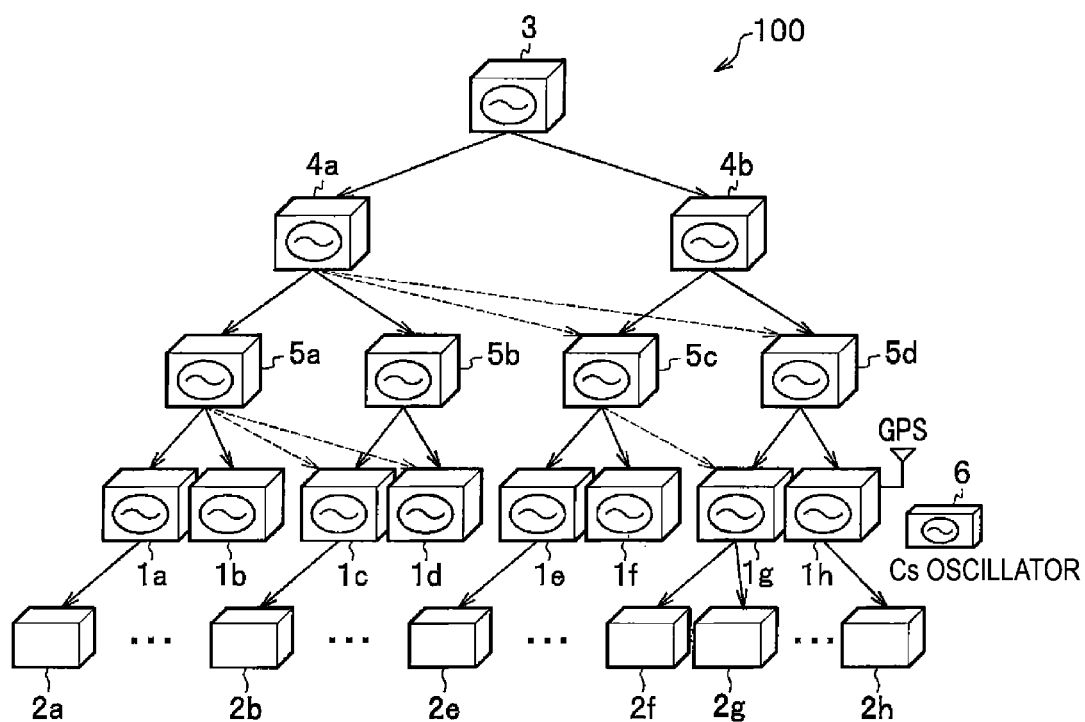
FIG. 1 is a configuration diagram of a clock network using clock frequency monitoring apparatuses according to a first embodiment of the present disclosure.

Hereinafter, embodiments of the present disclosure (hereinafter referred to as "present embodiments") will be described in detail with reference to the drawings. It is to be noted that the drawings are merely schematic illustrations to allow sufficient understanding of the present disclosure. In the drawings, common or similar components are denoted by the same reference signs and duplicated descriptions thereof will be omitted.

First Embodiment

FIG. 1 is a configuration diagram of a clock network using clock frequency monitoring apparatuses according to a first embodiment of the present disclosure.

Frequency deviation occurs between transmitting and receiving sides on an Ethernet (trade name) network because Ethernet is asynchronous. To transmit a clock on an Ethernet network, it is necessary to synchronize an internal oscillation frequency of each apparatus with a clock signal. Therefore, a master clock supply apparatus 3 and a plurality of clock supply apparatuses 4a, 4b, 5a, 5b, 5c, 5d, 1a, 1b, 1c, 1d, 1e, 1f, 1g, and 1h which are frequency monitoring apparatuses employ a synchronous Ethernet (SyncE) technology.

That is, in the clock network 100, each clock supply apparatus recovers clock signals (analog signals) for transmission devices by extracting the clock timing (the rise timing of a bit string) of an Ethernet signal transmitted from the upstream side. Then, the clock supply apparatus performs frequency conversion into an Ethernet signal speed of Gb Ethernet and transmits the clock signals to the downstream side. In this way, the clock network 100 transmits clocks from upstream to downstream sides in a pyramid shape via a physical layer.

The clock network 100 includes a master clock supply apparatus 3, a plurality of clock supply apparatuses 4a, 4b, 5a, 5b, 5c, 5d, 1a, 1b, 1c, 1d, 1e, 1f, 1g, and 1h, clock supply target devices 2a, 2b, . . . , 2e, 2f, 2g, and 2h which are connected to the end clock supply apparatuses 1a, 1b, 1c, 1d, 1e, 1f, 1g, and 1h, and a cesium oscillator 6 with which one or a plurality of clock supply target devices 1h are provided.

The master clock supply apparatus 3 generates a master clock. The clock supply apparatuses 4a and 4b are arranged, for example, in relay buildings between prefectures and generate clocks synchronized with the master clock. The clock supply apparatuses 5a, 5b, 5c, and 5d are arranged, for example, in relay buildings in prefectures. The clock supply apparatuses 5a and 5b generate clocks synchronized with the clock supply apparatus 4a. The clock supply apparatuses 5c and 5d generate clocks synchronized with the clock supply apparatus 4b.

The clock supply apparatuses 5c and 5d employ a redundant configuration such that they generate clocks synchronized with the clock supply apparatus 4a as a standby when they cannot generate clocks synchronized with the clock supply apparatus 4b. Here, paths through which the lower-level clock supply apparatuses 5a and 5b receive clocks generated by the higher-level clock supply apparatus 4a in a normal state will be referred to as selected-system (or normal (N)-system) clock paths. Paths through which the lower-level clock supply apparatuses 5c and 5d receive clocks generated by the higher-level clock supply apparatus 4a in an abnormal state will be referred to as standby-system (or emergency (E)-system) clock paths.

The clock supply apparatuses 1a, 1b, 1c, 1d, 1e, 1f, 1g, and 1h are arranged, for example, in terminal buildings. The clock supply apparatuses 1a and 1b generate clocks synchronized with the clock supply apparatus 5a. The clock supply apparatuses 1c and 1d generate clocks synchronized with the clock supply apparatus 5b. The clock supply apparatuses 1e and 1f generate clocks synchronized with the clock supply apparatus 5c. The clock supply apparatuses 1g and 1h generate clocks synchronized with the clock supply apparatus 5d.

For example, when the clock supply apparatuses 1c and 1d cannot generate clocks synchronized with the clock supply apparatus 5b, they generate clocks synchronized with the clock supply apparatus 5a as a standby. When the clock supply apparatuses 1g and 1h cannot generate clocks synchronized with the clock supply apparatus 5d, they generate clocks synchronized with the clock supply apparatus 5c as a standby.

A Global Positioning System (GPS) or a cesium oscillator 6 may be connected to the plurality of clock supply apparatuses 1a, 1b, 1c, 1d, 1e, 1f, 1g, and 1h arranged in terminal buildings in order to monitor the frequency accuracy of clocks.

The clock supply target devices 2a, 2b, 2c, 2e, 2f, 2g, and 2h are transmission devices, dedicated service nodes, or the like. For example, one clock supply apparatus 1g may be connected to a plurality of clock supply target devices 2g and 2h as illustrated in FIG. 1.

Figure 2:
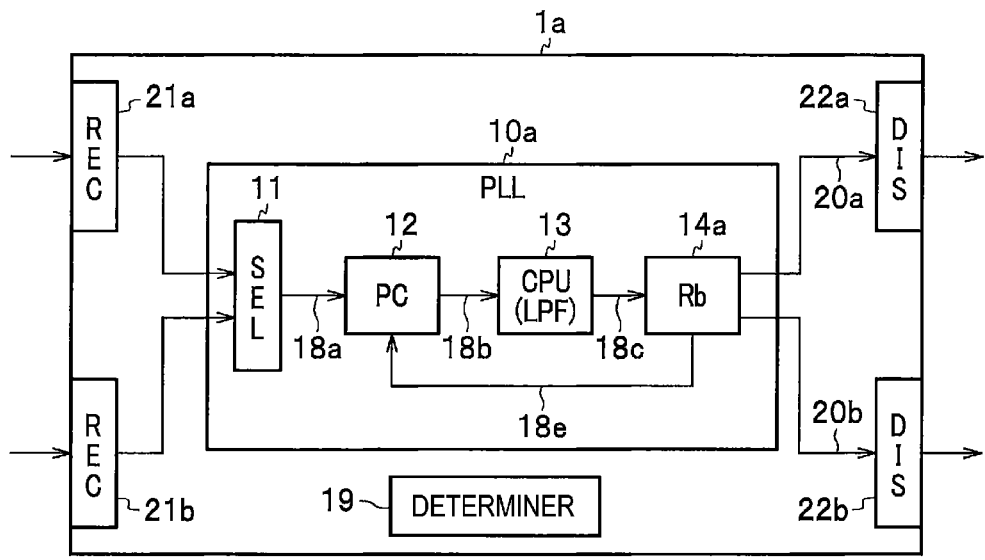
FIG. 2 is a configuration diagram of a clock frequency monitoring apparatus according to the first embodiment of the present disclosure.

FIG. 2 is a configuration diagram of a clock frequency monitoring apparatus according to the first embodiment of the present disclosure.

The clock supply apparatus 1a which is the clock frequency monitoring apparatus includes a plurality of frequency receivers (Receiver (REC)) 21a and 21b, a Phase Looked Loop (PLL) oscillation circuit 10a, a determiner 19, and a plurality of frequency distributors (Distribution (DIS)) 22a and 22b. The frequency receivers 21a and 21b receive clocks via the physical layer. The frequency receiver 21a receives a clock of a selected-system clock path and the frequency receiver 21b receives a clock of a standby-system clock path. The frequency distributors 22a and 22b distribute recovered clocks 20a and 20b which are recovered by the PLL oscillation circuit 10a to the clock supply target devices 2a, 2b, 2c, 2e, 2f, 2g, or 2h (FIG. 1).

The PLL oscillation circuit 10a generates a synchronous clock 18e and recovered clocks 20a and 20b which are phase-synchronized with a clock of one of the selected-system clock path and the standby-system clock path. The PLL oscillation circuit 10a includes a selector (SEL) 11, a phase difference detector (Phase Comparator (PC)) 12 which is a phase comparator, a Central Processing Unit (CPU) 13, and a loopback oscillator (Rb) 14a.

The selector 11 switches between the selected-system clock path and the standby-system clock path and outputs a clock of one of the selected-system clock path and the standby-system clock path to the phase difference detector 12. The phase difference detector 12 is a phase comparator that outputs a phase comparison signal 18b indicating the phase difference between an input clock 18a selected by the selector 11 and a feedback clock (a synchronous clock 18e) generated by the loopback oscillator 14a. The CPU 13 performs low-pass filtering (Low Pass Filter (LPF)) calculation on the phase comparison signal 18b. Through this calculation, the CPU 13 outputs a voltage value (a control value 18c) that specifies the frequency of clocks to be generated by the loopback oscillator 14a (the synchronous clock 18e and the recovered clocks 20a and 20b). The determiner 19 observes the variation amount of the control value 18c which is the output signal and determines whether the frequency is normal or abnormal based on whether the variation amount is small or large.

Figure 3:
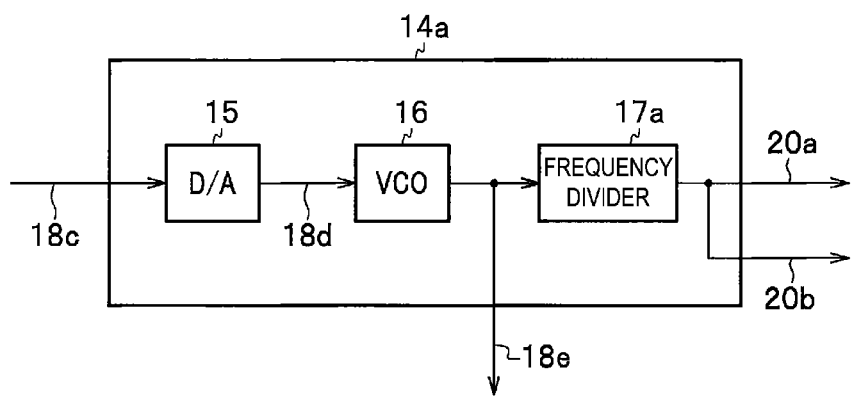
FIG. 3 is a configuration diagram of a loopback oscillator.

FIG. 3 is a block diagram of the loopback oscillator.

The loopback oscillator 14a includes a D/A converter 15, a voltage controlled oscillator 16, and a frequency divider 17a.

The D/A converter 15 converts the digital signal of the control value 18c output by the CPU 13 into an analog signal. The voltage controlled oscillator 16 generates a clock (a synchronous clock 18e) having a frequency corresponding to the analog signal of the control value 18c. The voltage controlled oscillator 16 is configured, for example, by adding a variable capacitance diode to an LC resonance circuit or a crystal. The frequency divider 17a performs (1/N (for example, N=99)) frequency division on the synchronous clock 18e to generate recovered clocks 20a and 20b. The loopback oscillator 14a may be a rubidium oscillator whose frequency can be changed using a digital signal.

The PLL oscillation circuit 10a performs feedback control such that the frequency of the input clock 18a and the frequency of the synchronous clock 18e generated by the voltage controlled oscillator 16 match. Thus, the phase difference detector 12 outputs a phase comparison signal 18b having a predetermined steady phase difference. For example, when the frequency of the input clock 18a, which is the selected-system clock or the standby-system clock, is 6.312 MHz, the frequency of the synchronous clock 18e is 6.312 MHz and the recovered clocks 20a and 20b after frequency division are 64 kHz.

Figure 4:
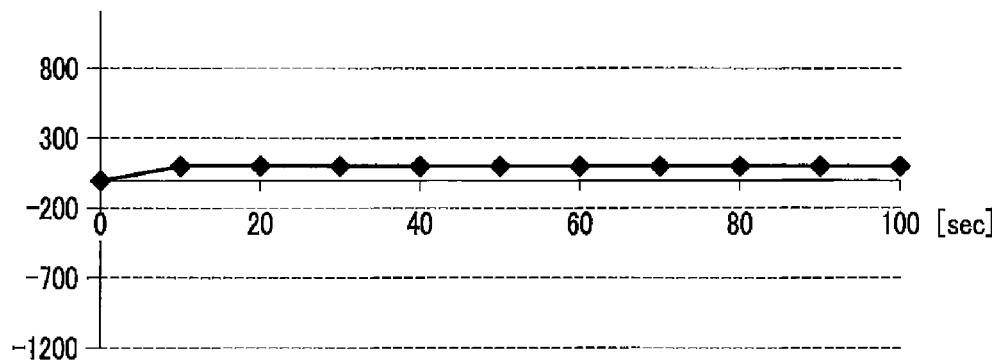
FIG. 4 is a diagram illustrating a time variation of a control value when a clock input to the clock frequency monitoring apparatus is normal.
Figure 5:
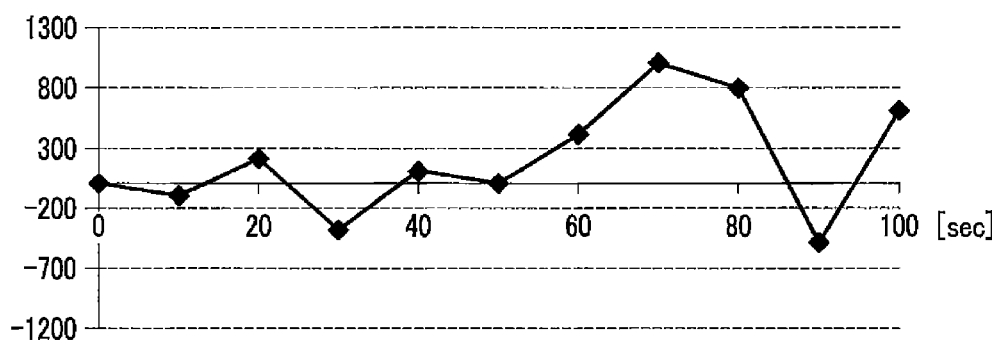
FIG. 5 is a diagram illustrating a time variation of a control value when a clock input to the clock frequency monitoring apparatus is abnormal.

FIG. 4 is a diagram illustrating the time variation of a control value when a clock input to the clock frequency monitoring apparatus is normal and FIG. 5 is a diagram illustrating the time variation of a control value when a clock input to the clock frequency monitoring apparatus is abnormal. The vertical axis represents the control value (digital value) 18c from −1200 to 1300 and the horizontal axis represents the time from 0 to 100 [sec].

In FIG. 4, there is no frequency deviation between the input clock 18a and the synchronous clock 18e and the control value 18c is exhibited as a constant value because the input clock (selected-system clock or standby-system clock) is normal. On the other hand, in FIG. 5, an abnormality occurs in the frequency of the input clock, a frequency deviation occurs between the input clock 18a and the synchronous clock 18e, and the control value 18c varies. Especially, the control value 18c exhibits a large variation amount in a time interval from 60 to 80 [sec] and it is inferred that the input clock 18a exhibits an abnormal state. The determiner 19 of the clock supply apparatus 1a functions as a clock frequency monitoring apparatus that monitors whether the input clock 18a (the selected-system clock or the standby-system clock) is normal or abnormal by observing the variation amount (variation amplitude) of the control value 18c as described above.

Second Embodiment

In the first embodiment, whether the selected-system clock is normal or abnormal is determined by observing the control value 18c when recovering the selected-system clock. However, whether a standby-system clock is normal or abnormal can be determined by observing transitions of a control value 18c obtained by performing low-pass filtering (LPF) calculation of the phase difference between a synchronous clock 18e of a selected-system clock and the standby-system clock.

Figure 6:
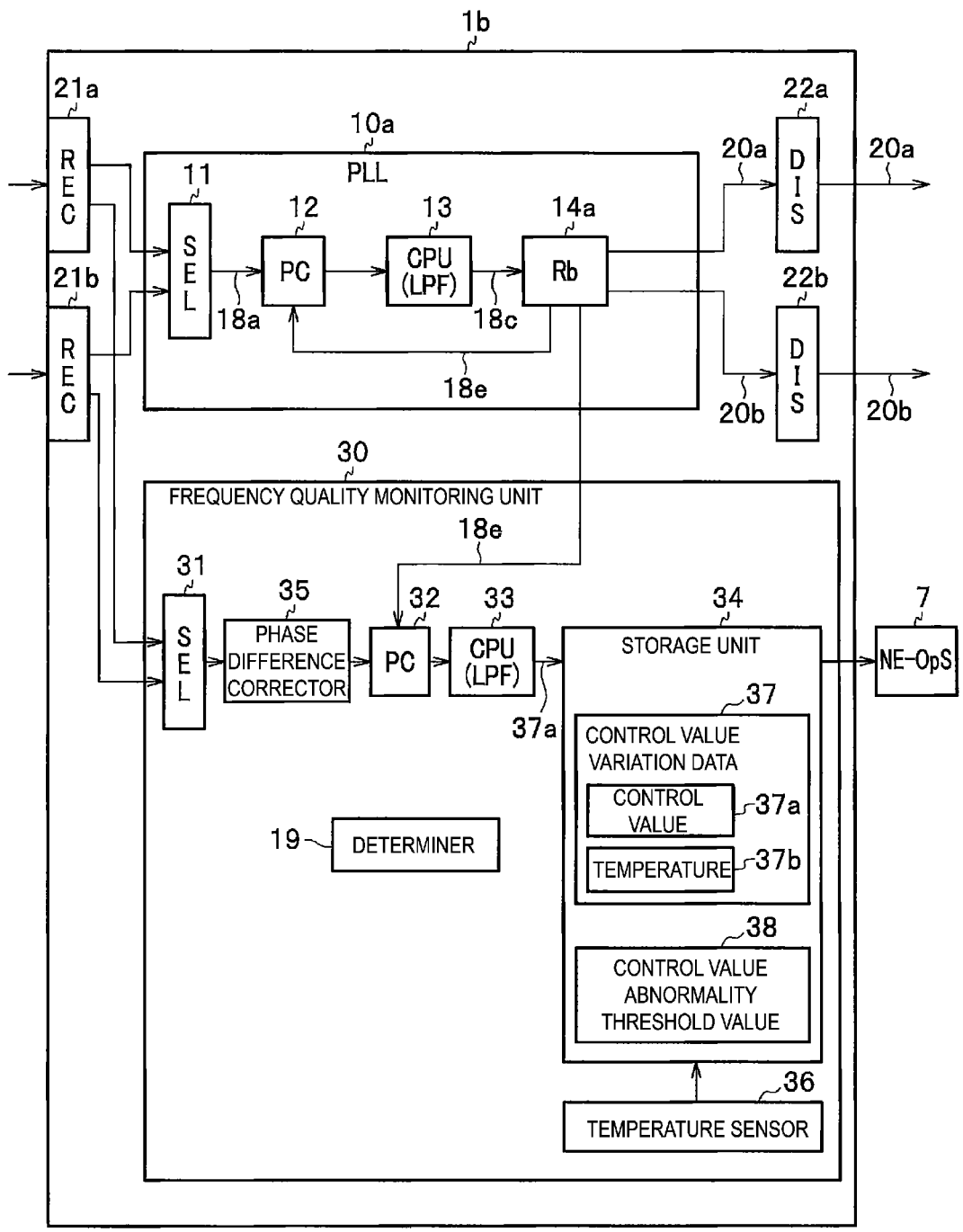
FIG. 6 is a configuration diagram of a clock frequency monitoring apparatus according to a second embodiment of the present disclosure.

FIG. 6 is a configuration diagram of a clock frequency monitoring apparatus according to a second embodiment of the present disclosure.

A clock supply apparatus 1b which is the clock frequency monitoring apparatus includes a frequency monitoring unit 30 in addition to a plurality of frequency receivers 21a and 21b, a PLL oscillation circuit 10a, and a plurality of frequency distributors 22a and 22b which have been described in the first embodiment.

The frequency monitoring unit 30 includes a selector (SEL) 31, a phase difference detector (PC) 32, a CPU 33, a storage unit 34, a phase difference corrector 35, a temperature sensor 36, and a determiner 19 and is communicatively connected to an external network operation system (NE-OpS) 7.

The selector 31 outputs a clock of a standby-system clock path to the phase difference corrector 35 when the selector 11 has selected a selected-system clock path and outputs a clock of the selected-system clock path to the phase difference corrector 35 when the selector 11 has selected the standby-system clock path. That is, the selector 31 performs output in a manner exclusive to the selector 11.

The phase difference corrector 35 corrects the phase difference of the clock of one of the selected-system clock path and the standby-system clock path selected by the selector 31 and outputs the phase-corrected clock to the phase difference detector 32. An amount by which the phase difference corrector 35 has corrected the phase difference is, for example, a phase difference, in a normal state, between the clock of the selected-system clock path and the clock of the standby-system clock path.

The phase difference detector 32 outputs the phase difference between the output clock of the phase difference corrector 35 and the synchronous clock 18e output by the voltage controlled oscillator 16 (in FIG. 3) of the loopback oscillator 14a. The CPU 33 performs low-pass filtering (LPF) calculation on the phase difference output by the phase difference detector 32 and outputs a control value 37a. The storage unit 34 stores control value variation data 37 and a control value abnormality threshold value 38. The control value variation data 37 is time series data of a combination of the control value 37a and temperature 37b. The temperature sensor 36 detects the temperature 37b which is a variation factor of noise (jitter or wander) and stores the temperature 37b in the storage unit 34.

The determiner 19 regards the frequency as abnormal when the difference between the control value 37a and the control value abnormality threshold value 38 becomes a predetermined amount or more.

Figure 7:
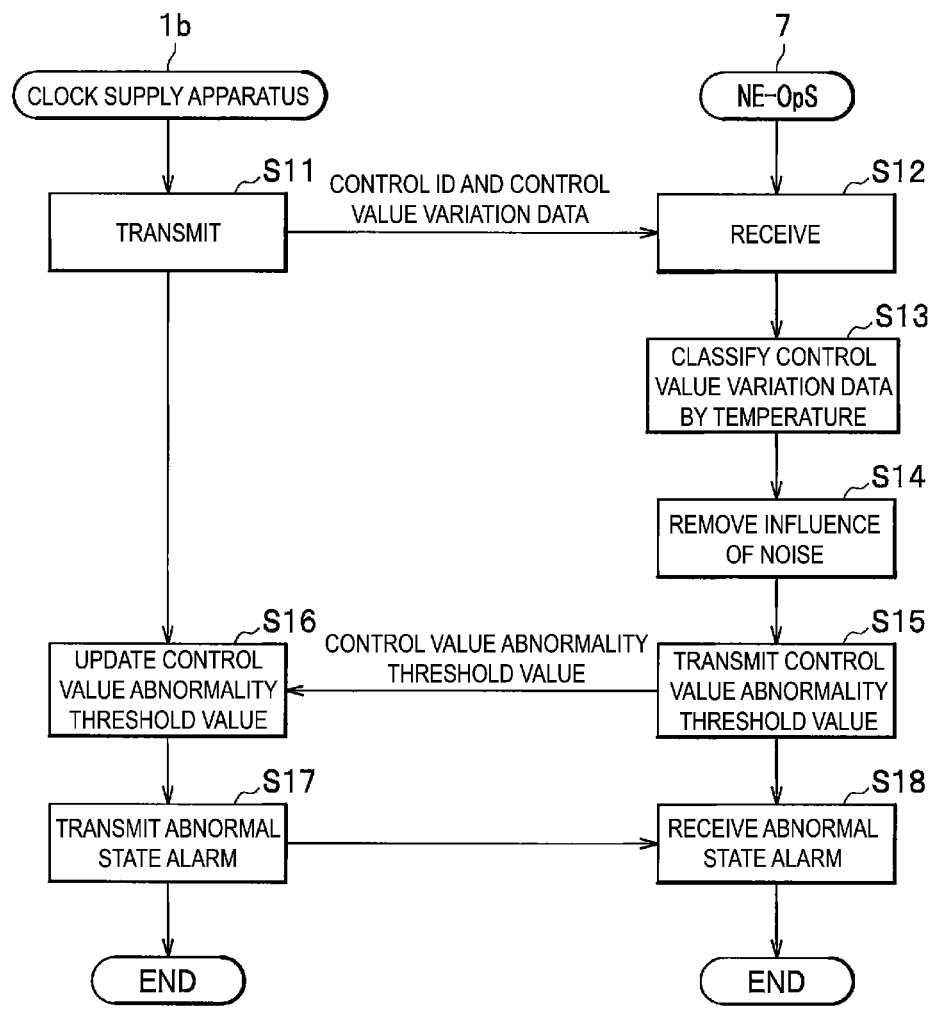
FIG. 7 is a flowchart illustrating the operation of the clock frequency monitoring apparatus according to the second embodiment of the present disclosure.

FIG. 7 is a flowchart illustrating the operation of the clock frequency monitoring apparatus according to the second embodiment of the present disclosure.

The clock supply apparatus 1b which is the clock frequency monitoring apparatus transmits a control ID identifying the clock supply apparatus 1b itself, the control value variation data 37, and the control value abnormality threshold value 38 to a network operation system 7 (S11). The network operation system 7 receives these data (S12), classifies the control value 37a in the control value variation data 37 by the temperature 37b, and determines the distribution width of the control value 37a for each temperature 37b (S13). The network operation system 7 regards the determined distribution width of the control value 37a as an influence of noise and specifies a control value with the influence of noise removed for each temperature 37b (S14). The network operation system 7 transmits upper and lower limit values of the control value 37a with the influence of the noise removed to the clock supply apparatus 1b as the control value abnormality threshold value 38 (S15). The clock supply apparatus 1b updates the control value abnormality threshold value 38 in the storage unit 34 (S16). Then, when a successively measured control value 37a deviates from the control value abnormality threshold value 38, the clock supply apparatus 1b regards the deviation as an abnormality in the clock frequency and sends an alarm to the network operation system 7 (S17). The network operation system 7 receives the alarm (S18) and notifies an operator.

In the clock supply apparatus 1b of the present embodiment, the frequency monitoring unit 30 calculates the control value 37a by performing low-pass filtering (LPF) calculation on the phase difference between the selected-system clock recovered by the PLL oscillation circuit 10a and the standby-system clock as described above. The control value 18c obtained through low-pass filtering calculation of the phase difference in the PLL oscillation circuit 10a corresponds to a frequency. Similarly, the control value 37a obtained through low-pass filtering (LPF) calculation of the phase difference in the frequency monitoring unit 30 also corresponds to a frequency. That is, the determiner 19 can determine frequency abnormality based on the behavior of the control value 37a.

Comparative Example

A comparative example for comparison with the clock supply apparatuses 1a and 1b of the first and second embodiments uses a GPS or a cesium oscillator 6 to monitor the frequency of a standby-system clock. For example, the clock supply apparatus 1h (in FIG. 1) is provided with the GPS and the cesium oscillator 6. According to this, a frequency quality control unit for monitoring the frequency requires GPS signals for reference and the expensive cesium oscillator 6 having high frequency stability.

In contrast to the comparative example, the determiner 19 of the clock supply apparatus 1a of the first embodiment determines whether the frequency is normal or abnormal based on whether the variation amount of the control value 18c is small or large. The determiner 19 of the clock supply apparatus 1b of the second embodiment regards the frequency as abnormal when the difference between the control value 37a and the control value abnormality threshold value 38 becomes a predetermined amount or more. Therefore, the clock supply apparatuses 1a and 1b of the first and second embodiments do not need the GPS or the cesium oscillator 6 for frequency monitoring and thus the costs are low.

Third Embodiment

Although the clock supply apparatuses 1a and 1b feed the synchronous clock 18e generated by the loopback oscillator 14a back to the phase difference detector 12, the synchronous clock 18e may also be fed back to the phase difference detector 12 after being frequency-divided.

Figure 8:
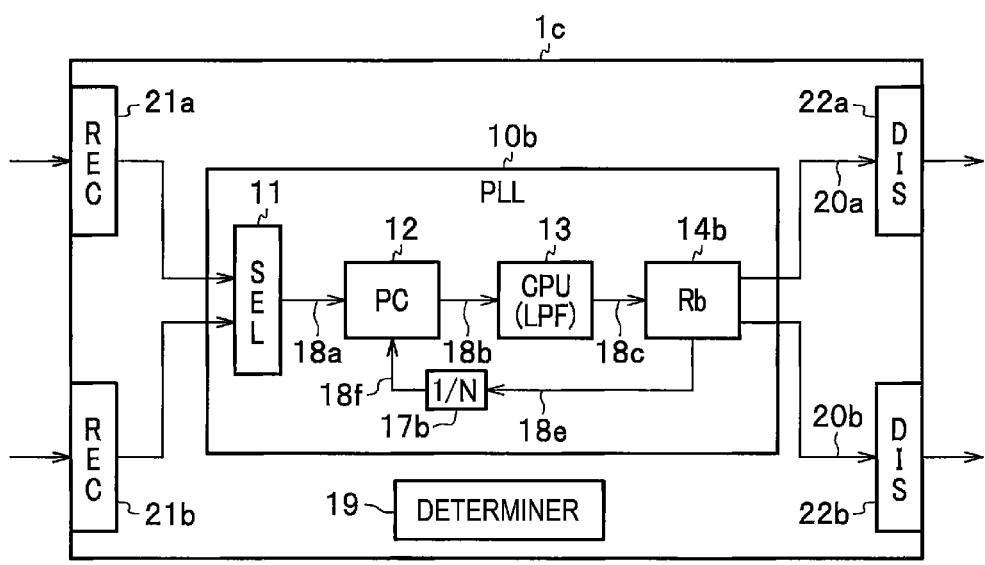
FIG. 8 is a configuration diagram of a clock frequency monitoring apparatus according to a third embodiment of the present disclosure.

FIG. 8 is a configuration diagram of a clock frequency monitoring apparatus according to a third embodiment of the present disclosure.

A clock supply apparatus 1c which is the clock frequency monitoring apparatus includes a plurality of frequency receivers 21a and 21b, a PLL oscillation circuit 10b, and a plurality of frequency distributors 22a and 22b, similar to the clock supply apparatuses 1a (in FIG. 2) and 1b (in FIG. 6) of the first embodiment. The PLL oscillation circuit 10b includes a selector 11, a phase difference detector 12, a Central Processing Unit (CPU) 13, a loopback oscillator 14b, and a frequency divider 17b. The loopback oscillator 14b does not include the frequency divider 17a (in FIG. 3) and outputs the synchronous clock 18e generated by the voltage controlled oscillator 16 (in FIG. 3) as recovered clocks 20a and 20b.

The frequency divider 17b performs 1/N frequency division on the synchronous clock 18e generated by the loopback oscillator 14b and inputs a frequency-divided clock 18f to the phase difference detector 12. That is, the phase difference detector 12 outputs the phase difference between the input clock 18a and the frequency-divided clock 18f to the CPU 13. The CPU 13 performs low-pass filtering (LPF) calculation to output a control value 18c for voltage-controlling the oscillation frequency of the loopback oscillator 14b.

Thus, the loopback oscillator 14b generates the synchronous clock 18e and the recovered clocks 20a and 20b having a frequency N times that of the input clock 18a. For example, the frequency of the recovered clocks 20a and 20b is 6.312 MHz when the frequency of the input clock 18a is 64 kHz in the case of N=99.

Modifications

The present disclosure is not limited to the above embodiments and various modifications, for example, such as the following can be made.

Figure 9:
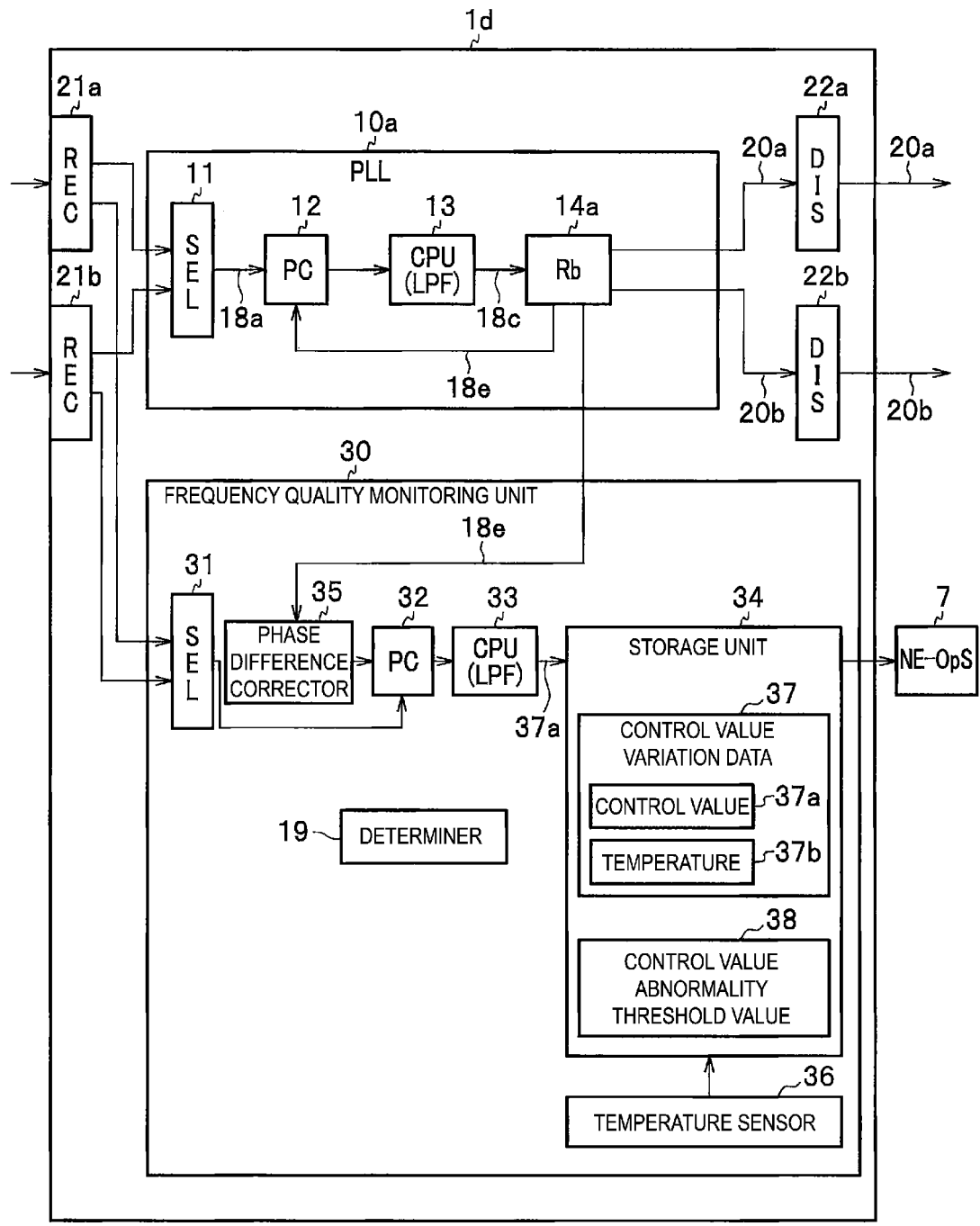
FIG. 9 is a configuration diagram of a clock frequency monitoring apparatus which is a modification of the present disclosure.

The phase difference detector 32 (in FIG. 6) of the second embodiment outputs the phase difference between the synchronous clock 18e and the output clock of the phase difference corrector 35. As illustrated in FIG. 9, a phase difference corrector 35 may be used to generate a clock with a corrected phase of the synchronous clock 18e and a phase difference detector 12 may be used to generate a phase difference between the clock with the corrected phase of the synchronous clock 18e and the input clock of the standby-system path.

REFERENCE SIGNS LIST 1,1a, 1b, 1c, 1d, 1e, 1f, 1g, 1h Clock supply apparatus (clock frequency monitoring apparatus)
2a, 2b, 2c, 2h Clock supply target device
3 Master clock supply apparatus
4a, 4b Clock supply apparatus (clock frequency monitoring apparatus)
5a, 5b, 5c, 5d Clock supply apparatus (clock frequency monitoring apparatus)
6 Cesium oscillator
7 Network operation system
10a, 10b PLL oscillation circuit
12 Phase difference detector (phase comparator)
13 CPU (low-pass filter, LPF)
14a, 14b Loopback oscillator
16 Voltage controlled oscillator
17a, 17b Frequency divider
18a Input clock
18b Phase comparison signal
18c Control value (output signal)
19 Determiner
21a, 21b Frequency receiver
22a, 22b Frequency distributor
30 Frequency monitoring unit
33 CPU
37 Control value variation data
37a Control value
38 Control value abnormality threshold value
100 Clock network

The invention claimed is:

1. A clock frequency monitoring apparatus that recovers a synchronous clock synchronized with a first input clock and monitors a frequency of a second input clock that is to be frequency-synchronized with the first input clock, the clock frequency monitoring apparatus comprising:
a first phase comparator configured to compare a phase of the synchronous clock or a first frequency-divided clock obtained by frequency-dividing the synchronous clock with a phase of the first input clock;
a first filter configured to low-pass filter an output signal of the first phase comparator;
an oscillator configured to generate the synchronous clock having a frequency corresponding to an output signal of the first filter;
a second phase comparator configured to compare a phase of the synchronous clock or the first frequency-divided clock with a phase of the second input clock;
a second filter configured to low-pass filter an output signal of the second phase comparator; and
a determiner configured to determine that the frequency of the second input clock is abnormal when a variation amplitude of an output signal of the second filter is equal to or more than a predetermined range.

2. The clock frequency monitoring apparatus according to claim 1, wherein the predetermined range is changed by a temperature of the clock frequency monitoring apparatus.

3. The clock frequency monitoring apparatus according to claim 1, further comprising a distributor configured to distribute the synchronous clock or a second frequency-divided clock obtained by frequency-dividing the synchronous clock.

4. A clock frequency monitoring method performed by a clock frequency monitoring apparatus that recovers a synchronous clock synchronized with a first input clock and monitors a frequency of a second input clock that is to be frequency-synchronized with the first input clock, the clock frequency monitoring method comprising the steps of:

first comparing a phase of the synchronous clock or a first frequency-divided clock obtained by frequency-dividing the synchronous clock with a phase of the first input clock;

first low-pass filtering an output signal of the first comparing step;

causing an oscillator to generate the synchronous clock having a frequency corresponding to a first low-pass filtered signal calculated in the first low-pass filtering step;

second comparing a phase of the synchronous clock or the first frequency-divided clock with a phase of the second input clock;

performing second low-pass filtering calculation of an output signal of the second comparing step; and determining that the frequency of the second input clock is abnormal when a variation amplitude of a second low-pass filtered signal calculated in the performing step is equal to or more than a predetermined range.

5. The clock frequency monitoring method according to claim 4, wherein the predetermined range is changed by a temperature of the clock frequency monitoring apparatus.

6. The clock frequency monitoring method according to claim 4, further comprising the step of:

distributing the synchronous clock or a second frequency-divided clock obtained by frequency-dividing the synchronous clock.

* * * * *